(12) United States Patent
Mori et al.

(10) Patent No.: US 8,680,640 B2
(45) Date of Patent: Mar. 25, 2014

(54) SOLID-STATE IMAGING DEVICE

(75) Inventors: Mitsuyoshi Mori, Kyoto (JP); Toru Okino, Osaka (JP); Yutaka Hirose, Kyoto (JP); Yoshihisa Kato, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/462,895

(22) Filed: May 3, 2012

(65) Prior Publication Data
US 2012/0211851 A1    Aug. 23, 2012

Related U.S. Application Data

(63) Continuation of application No. PCT/JP2010/004906, filed on Aug. 4, 2010.

(30) Foreign Application Priority Data

Nov. 25, 2009   (JP) .................................. 2009-267550

(51) Int. Cl.
 *H01L 27/148* (2006.01)
(52) U.S. Cl.
 USPC ........... 257/440; 257/446; 257/462; 257/113; 257/186; 257/292; 257/E31.069; 257/E31.071; 257/E31.073; 257/E31.082; 257/E31.096
(58) Field of Classification Search
 USPC ......... 257/440, 443, 444, 446, 462, 113, 186, 257/292, E31.063, E31.069, E31.071, 257/E31.073, E31.079, E31.082, E31.096, 257/E31.115
 See application file for complete search history.

(56) References Cited

U.S. PATENT DOCUMENTS

| | | | |
|---|---|---|---|
| 7,535,073 B2 * | 5/2009 | Ezaki | ............................ 257/440 |
| 7,687,875 B2 * | 3/2010 | Lee | ............................... 257/462 |
| 2004/0080638 A1 | 4/2004 | Lee | |
| 2006/0043519 A1 | 3/2006 | Ezaki | |

(Continued)

FOREIGN PATENT DOCUMENTS

| | | |
|---|---|---|
| JP | 4130891 B | 5/2004 |
| JP | 2005-353994 | 12/2005 |

(Continued)

OTHER PUBLICATIONS

International Search Report of PCT Application No. PCT/JP2010/004906, dated Nov. 9, 2010.

*Primary Examiner* — Michael Shingleton
(74) *Attorney, Agent, or Firm* — Panasonic Patent Center

(57) ABSTRACT

A solid-state imaging device includes semiconductor substrate; a plurality of photoelectric conversion sections of n-type that are formed at an upper part of semiconductor substrate and arranged in a matrix; output circuit that is formed on a charge detection surface that is one surface of semiconductor substrate and detects charges stored in photoelectric conversion sections; a plurality of isolating diffusion layers of a p-type that are formed under output circuit and include high concentration p-type layers adjacent to respective photoelectric conversion sections; and color filters formed on a light incident surface that is the other surface opposing the one surface of semiconductor substrate and transmit light with different wavelengths. Shapes of respective photoelectric conversion sections correspond to color filters and differ depending on the high concentration p-type layer configuring isolating diffusion layer.

15 Claims, 7 Drawing Sheets

(56) References Cited

U.S. PATENT DOCUMENTS

| | | |
|---|---|---|
| 2006/0163618 A1 | 7/2006 | Park |
| 2007/0152250 A1 | 7/2007 | Kim |
| 2008/0111169 A1* | 5/2008 | Liu et al. .................. 257/292 |
| 2009/0045415 A1 | 2/2009 | Koshiba |
| 2009/0200591 A1 | 8/2009 | Park |
| 2009/0212383 A1 | 8/2009 | Ezaki |
| 2009/0321800 A1* | 12/2009 | Ohkawa .................. 257/292 |
| 2012/0001290 A1* | 1/2012 | Sawada .................. 257/440 |

FOREIGN PATENT DOCUMENTS

| | | |
|---|---|---|
| JP | 2006-73682 | 3/2006 |
| JP | 2006-210919 | 8/2006 |
| JP | 2007-184603 | 7/2007 |
| JP | 2007-201267 | 8/2007 |
| JP | 2009-4615 | 1/2009 |
| JP | 2009-065098 | 3/2009 |
| JP | 2009-081169 | 4/2009 |

\* cited by examiner

--PRIOR ART--

SOLID-STATE IMAGING DEVICE

BACKGROUND

1. Technical Field

The present invention relates to a solid-state imaging device in which pixel sections including photoelectric conversion sections are arranged in a matrix.

2. Background Art

In recent years, a MOS (Metal Oxide Semiconductor) type solid-state imaging device is gaining attention as a device capable of being driven with low power consumption and shooting at high speed, and is starting to be installed in various fields such as a cell phone camera, an in-vehicle camera and a surveillance camera.

FIG. 6 shows a circuit configuration of a typical MOS type solid-state imaging device. As shown in FIG. 6, pixel sections 100 including photoelectric conversion sections (photodiodes) 101 configure an imaging region by being arranged in a matrix. Charges that are photoelectrically converted by photoelectric conversion sections 101 are transferred to floating diffusion layers (floating diffusion) 102 by transfer transistors 103. The charges that were transferred to floating diffusion layer 102 are amplified in amplifying transistors 104, and are transmitted to output signal line 111 through selected transistors 106 selected by vertical shift register 108. Further, the amplified charges are outputted from output terminal 112 through horizontal shift registers 109. Note that, excessive charges stored in floating diffusion layer 102 are discharged by reset transistors 105 whose drain regions are connected to power lines 107.

FIG. 7 shows a cross sectional configuration of pixel sections 100 according to a conventional example (for example, refer to Unexamined Japanese Patent Publication No. 2006-210919). As shown in FIG. 7, p-type epitaxial layer 203 is formed on p-type semiconductor substrate 201. Each pixel section 100 is partitioned by element isolations 207, and one of green filter 227G that transmits green light, red filter 227R that transmits red light, and blue filter 227B that transmits blue light is arranged.

At an upper portion of p-type epitaxial layer 203, p-type first impurity injection regions 219 and n-type second impurity injection regions 217 at underneath p-type first impurity injection regions 219 are arranged, thereby configuring photodiodes that are the photoelectric conversion sections. Junction portions of n-type second impurity injection regions 217 and p-type epitaxial layer 203 also become the photoelectric conversion sections. At portions of p-type epitaxial layer 203 under each of second impurity injection regions 217, p+-type first embedded barrier layers 205 are continuingly formed. That is, a concentration of p-type impurities doped in first embedded barrier layers 205 is higher than a concentration of p-type impurities doped in p-type epitaxial layer 203.

Second embedded barrier layers 211 are formed above first embedded barrier layers 205 in p-type epitaxial layer 203 for pixel sections 100 provided with green filter 227G and blue filter 227B. Further, third embedded barrier layer 215 is formed on second embedded barrier layer 211 for pixel section 100 provided with blue filter 227B. Here, in second embedded barrier layer 211 and third embedded barrier layer 215, the p-type impurities are doped therein and have concentrations of substantially the same as the impurity concentration of first embedded barrier layer 205. Further, an upper portion of each of embedded barrier layers 205, 211 and 215 is separated from second impurity injection regions 217.

As described above, a crosstalk is prevented by adjusting widths and positions of depletion regions of the photodiodes depending on wavelength of light incident on respective pixel sections 100.

Further, there is a conventional art that prevents the crosstalk which changes an injection depth of the n-type impurities configuring the photodiodes, depending on the wavelength of light incident on the respective pixel sections and adjusts the depletion regions of the photodiodes, for example by forming the photodiode of the pixel section having the blue filter to be shallow and the photodiode of the pixel section having the red filter to be deep.

SUMMARY

However, there are problems as follows in the solid-state imaging device having the conventional photodiode configuration.

That is, although the solid-state imaging device shown in FIG. 7 has p-type embedded barrier layers with different thicknesses depending on the wavelength of light under the n-type second impurity injection regions configuring the photodiodes, since lifetime of generated charges is long in a case where impurity concentration of each embedded barrier layer is low, disappearance of the charges generated by undergoing the photoelectric conversion is delayed. Due to this, an inflow of the charges to the photodiodes of adjacent pixel sections occurs, and the crosstalk increases. For example, when incident light reaches the p-type embedded barrier layer under the n-type second impurity injection region, the charges are generated in this p-type region and flow into adjacent photodiodes.

Note that, if the n-type impurity injection regions configuring the photodiodes are formed at deep regions of the semiconductor substrate, although it is possible to prevent the light from reaching the p-type region, leakage of the light into the adjacent pixel sections by light component that is injected at an angle becomes significant, whereby the crosstalk increases.

Further, when the light component in long wavelength is removed by a color filter, although it is possible to prevent the light from reaching deep portions of the semiconductor substrate, an amount of the incident light decreases, whereby sensitivity to the light of long wavelength decreases.

On the other hand, in FIG. 7, although shapes of the p-type regions (embedded barrier layers) formed under the n-type impurity injection regions configuring the photodiodes are changed, in a case where the impurity concentration of the p-type region is high, a junction leakage between the n-type impurity injection region and the p-type regions increases, whereby noise is increased.

In view of the above conventional problems, the present invention aims to prevent photoelectrically converted charges from flowing into other pixel sections while maintaining sensitivity and reading property.

In order to achieve the above aim, the present invention has a configuration in which a solid-state imaging device is made to be of a backside-illumination type, and shapes of photoelectric conversion sections is made to differ depending on a wavelength of incident light.

Specifically, the solid-state imaging device of the present invention includes a semiconductor substrate; a plurality of photoelectric conversion sections of a first conductivity type that are formed in the semiconductor substrate and arranged in a matrix; a detection circuit section that is formed on a first surface of the semiconductor substrate and detects charges stored in the photoelectric conversion sections; a plurality of isolating diffusion layers of a second conductivity type that are formed in the semiconductor substrate at a side of the first surface under the detection circuit section and include impurity injection regions of the second conductivity type making contact with the photoelectric conversion sections; and a plurality of color filters that are formed on a second surface opposing the first surface of the semiconductor substrate and transmit light with different wavelengths, wherein shapes of the respective photoelectric conversion sections differ depending on the corresponding color filters.

According to the solid-state imaging device of the present invention, since the shapes of the respective photoelectric conversion sections correspond to the color filters and differ depending on the impurity injection regions configuring the isolating diffusion layers, a distance for example between the color filter that transmits relatively short-wavelength light and the photoelectric conversion section can be made shorter. As a result, a crosstalk by oblique incident light can be decreased. Further, since the shapes of the photoelectric conversion sections differ depending on the wavelength of light, the crosstalk can be decreased while maintaining sensitivity of the pixel sections.

In the solid-state imaging device of the present invention, the plurality of photoelectric conversion sections include a first photoelectric conversion section corresponding to a first color filter that has a maximum transparency in a first wavelength region and a second photoelectric conversion section corresponding to a second color filter that has the maximum transparency in a second wavelength region having longer wavelength than the first wavelength region, and a region in the second photoelectric conversion section with a maximum width in a direction parallel to the second surface is closer to the first surface than a region in the first photoelectric conversion section with the maximum width in the direction parallel to the second surface.

In configuring as above, since the photoelectric conversion section that receives the light with long wavelength is formed to the deep portion close to a charge detection surface side of the semiconductor substrate, it becomes possible to efficiently accumulate the photoelectrically converted charges in the photoelectric conversion section; thus, the crosstalk can be decreased while maintaining the high sensitivity. Further, since the shape of the photoelectric conversion section can be adjusted by adjusting the depth of the impurity injection regions of the second conductivity type on the charge detection surface side, the charge reading becomes possible at a low voltage. Further, since the impurity injection region of the second conductivity type can be made to have high concentration, the charge reading becomes possible at a low voltage while decreasing noise component.

In this case, the second photoelectric conversion section has a maximum cross sectional area in the direction parallel to the second surface inside the semiconductor substrate, compared to an opening area at the second surface and an opening area at the first surface.

In configuring as above, since the incident light reaching the deep portion close to the charge detection surface side of the semiconductor substrate can be gathered in the photoelectric conversion section effectively, the crosstalk can be decreased while maintaining the high sensitivity.

Further, in this case, the region in the second photoelectric conversion section with the maximum width in the direction parallel to the second surface is formed by extending to inside the isolating diffusion layer.

In configuring as above, since the incident light reaching the deep portion close to the charge detection surface side of the semiconductor substrate can be gathered in the photoelectric conversion section effectively, the crosstalk can be decreased while maintaining the high sensitivity. Further, even if a size of pixels is reduced and the isolating diffusion layers become similarly narrow, an electrical separation from adjacent photoelectric conversion sections becomes possible without performing the impurity injection to the impurity injection regions of the second conductivity type to deep positions, and thereby the crosstalk decreases.

In this case, the region in the second photoelectric conversion section with the maximum width in the direction parallel to the second surface is formed by extending to a first surface side under at least one first photoelectric conversion section that is adjacent to the second photoelectric conversion section.

In configuring as above, since the generated charges in the deep portion of the semiconductor substrate caused by the oblique incident light can be accumulated even in forming the photoelectric conversion sections at the deep portion close to the charge detection surface side of the semiconductor substrate, the crosstalk can be decreased while maintaining the high sensitivity.

Since the depth of the photoelectric conversion sections from a substrate surface can be adjusted according to the light wavelength, the solid-state imaging device of the present invention can realize high sensitivity and low crosstalk while maintaining the charge reading at low voltage.

DESCRIPTION OF EMBODIMENTS

Exemplary Embodiment

One exemplary embodiment of the present invention will be described with reference to FIG. 1. Note that, the present invention is not limited to this exemplary embodiment and below-described modifications. Further, the present invention can be changed as appropriate within the scope in which the effect of the present invention is exerted. Further, the present invention can be combined with the modifications.

Figure 6:
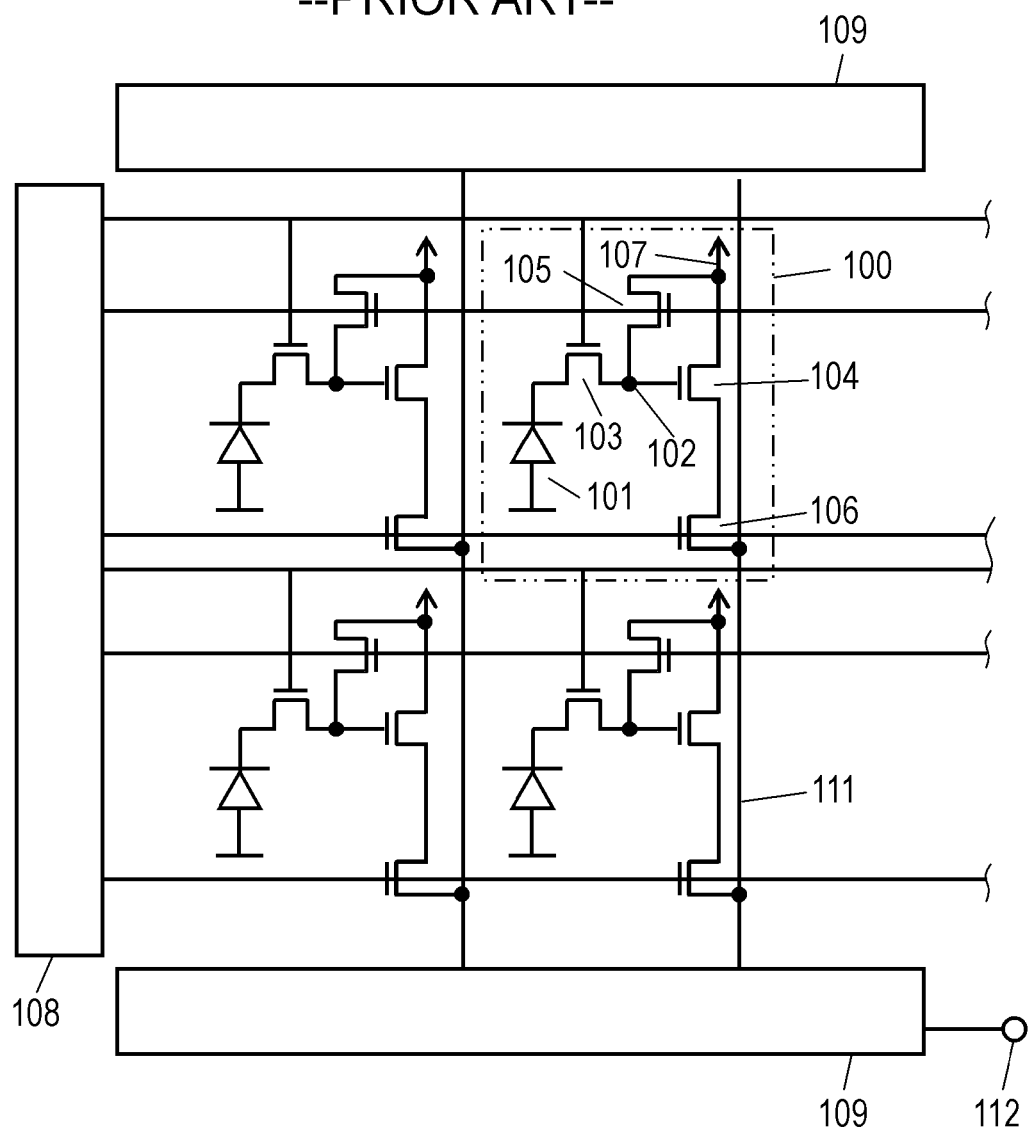
FIG. 6 is a circuit diagram showing a conventional MOS type solid-state imaging device.
Figure 7:
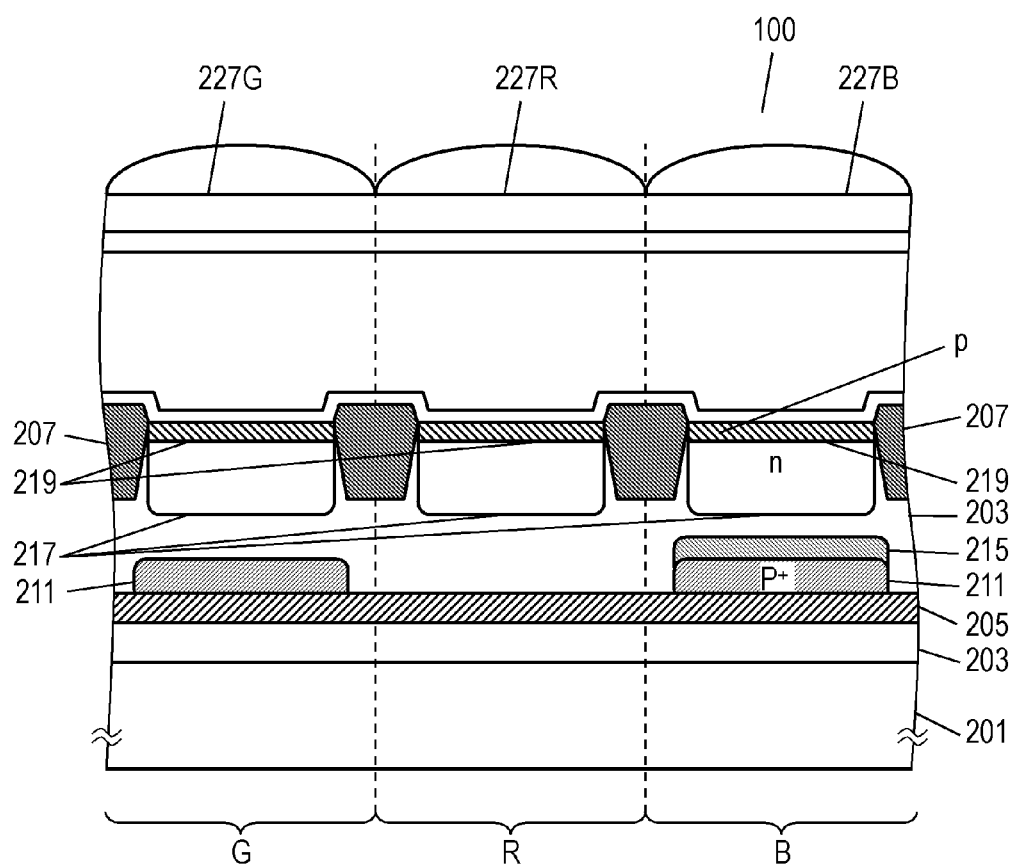
FIG. 7 is a schematic partial cross sectional view showing pixel sections in the conventional MOS type solid-state imaging device.

The solid-state imaging device according to the present invention is a MOS type solid-state imaging device in which a plurality of pixel sections are arranged in a matrix, and its basic circuit configuration is similar to that shown in FIG. 6.

Figure 1:
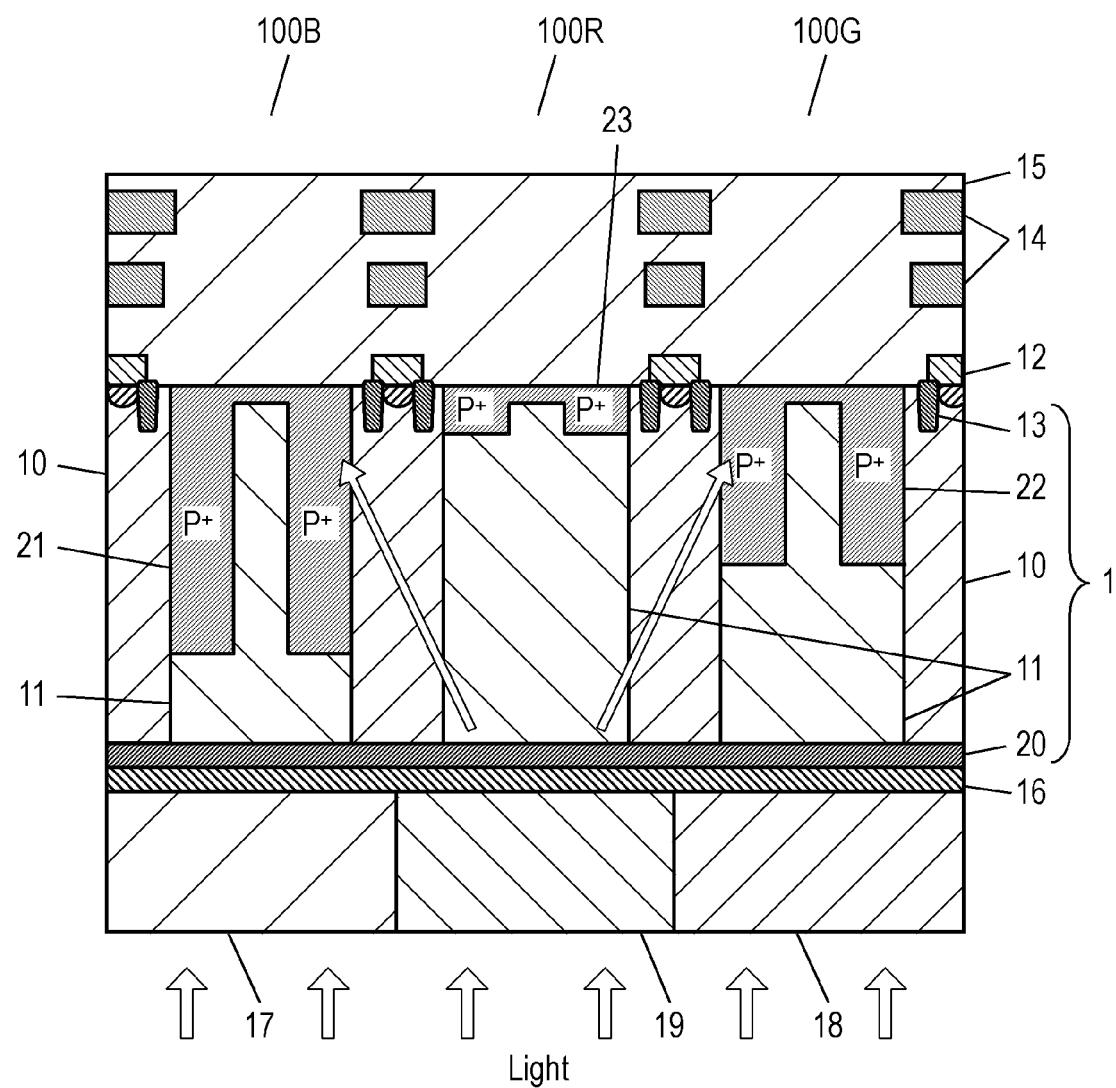
FIG. 1 is a schematic partial cross sectional view showing pixel sections in a solid-state imaging device of an exemplary embodiment of the present invention.

FIG. 1 is a cross sectional configuration of pixel sections 100B, 100G and 100R in the solid-state imaging device of the present exemplary embodiment, and three pixel sections are shown herein. Each of pixel sections 100B, 100G and 100R includes, for example, photoelectric conversion section (hereinafter, also referred to as a photodiode) 11 formed of an n-type diffusion region formed on semiconductor substrate 1 formed of silicon (Si); output circuit 12 formed of MOS type transistors that output charges accumulated in photodiode 11; and one of blue color filter 17, green color filter 18, and red color filter 19. Photodiode 11 and source/drain regions configuring output circuit 12 are electrically separated respectively by isolation sections 13.

Wirings 14 such as a drive line that drives output circuit 12 and an output line that outputs charges are formed in laminate on interlayer film 15 for example formed of silicon oxide. Isolating diffusion layers 10 of a p-type are respectively formed under isolation sections 13. Isolating diffusion layers 10 serve a role of electrically separating photodiodes 11 that are adjacent to one another, and prevent crosstalk between respective pixel sections 100B, 100G and 100R.

On a second surface of semiconductor substrate 1 opposite from a charge detection surface on which output circuit 12 is formed as a first surface, respective color filters 17, 18, and 19 are formed corresponding to respective pixel sections 100B, 100G and 100R by interposing insulation film 16 formed of silicon oxide or silicon nitride. Here, each of color filters 17, 18 and 19 may be in a publicly-known Bayer arrangement, or may be in other arrangements. Blue color filter 17 is a color filter that exhibits high transparency to light of short wavelength (about 450 nm), red color filter 19 is a color filter that exhibits high transparency to light of long wavelength (about 650 nm) and green color filter 18 is a color filter that exhibits high transparency to light of intermediate wavelength (about 550 nm) of blue color filter 17 and red color filter 19.

First high concentration p-type layer 20 is formed between photodiode 11 and insulation film 16 over an entirety of pixel sections 100B, 100G and 100R at constant depth. First high concentration p-type layer 20 suppresses charges that occur during dark conduction due to a defect (crystal defect) on a back surface (light incident surface) of semiconductor substrate 1 from flowing into photodiodes 11, and realizes low noise.

Second high concentration p-type layer 21, third high concentration p-type layer 22 and fourth high concentration p-type layer 23 are respectively formed between the charge detection surfaces (substrate surfaces) on which output circuits 12 are formed and photodiodes 11. Specifically, in pixel section 100R on which red color filter 19 is formed, fourth high concentration p-type layer 23 is formed shallow from the substrate surface, and in pixel section 100B on which blue color filter 17 is formed, second high concentration p-type layer 21 is formed deep from the substrate surface. In pixel section 100G in which green color filter 18 is formed, third high concentration p-type layer 22 is formed shallower than second high concentration p-type layer 21 and deeper than fourth high concentration p-type layer 23.

Note that, in order to transfer the stored charges in photodiodes 11 to floating diffusion layers (not shown), parts of regions in photodiodes (photoelectric conversion sections) 11 are formed shallow at a depth similar to the charge detection surface in each of pixel sections 100B, 100G and 100R. Further, each of high concentration p-type layers 21 to 23 suppresses the charges that occur during the dark conduction due to a defect on a front surface of semiconductor substrate 1 from flowing into photodiodes 11, and realizes low noise.

In the solid-state imaging device of the present exemplary embodiment, light is made incident from the light incident surface that is the back surface of semiconductor substrate 1 in which respective color filters 17 to 19 are provided, and photoelectrically converted charges by photodiodes 11 are accumulated and outputted. Note that, although in the present exemplary embodiment, a lens is not shown, it may be arranged above respective color filters 17 to 19.

In general, for the light incident on semiconductor substrate 1 formed of silicon, in a case of a wavelength of 450 nm, the light intensity is halved at a depth of about 0.3 μm, and further, in a case of a wavelength of 550 nm, the light intensity is halved at a depth of about 0.8 μm, and in a case of a wavelength of 650 nm, the light intensity is halved at a depth of about 2.3 μm. Accordingly, the incident light reaches deeper portions of semiconductor substrate 1 as the wavelength of light becomes longer, and thereby the crosstalk by the oblique incident light becomes apparent. Especially, because the MOS type solid-state imaging device forms wirings 14 in laminate on the surface of the semiconductor device, a distance from the charge detection surface of semiconductor substrate 1 to respective color filters 17 to 19 is elongated, and the influence of the crosstalk by the oblique incident light is increased. Thus, in order to shorten the distance between respective color filters 17 to 19 and semiconductor substrate 1, the solid-state imaging device of the present exemplary embodiment employs a configuration of the backside-illumination type that injects the light from the back surface by forming color filters 17 to 19 on a back surface side of semiconductor substrate 1 where wirings 14 are not formed.

Since transmitted light to pixel section 100R incident on red color filter 19 reaches the deep portion on the substrate surface side of semiconductor substrate 1, fourth high concentration p-type layer 23 is formed shallow from the substrate surface, and a forming region of photodiode 11 is made larger. Due to this, since the photoelectrically converted charges that are generated at the deep portion from the light incident surface in semiconductor substrate 1 can be stored, the crosstalk can be decreased. On the other hand, since transmitted light to pixel sections 100B and 100G injected respectively on blue color filter 17 and green color filter 18 reaches shallow region from the light incident surface of semiconductor substrate 1, second high concentration p-type layer 21 and third high concentration p-type layer 22 are formed shallow from the light incident surface. Accordingly, as shown in FIG. 1, even if the oblique incident light incident on red color filter 19 that transmits pixel section 100R reaches other pixel sections 100B and 100G adjacent to pixel section 100R having red color filter 19, since charges are generated by the photoelectric conversion at regions where photodiodes 11 are not formed, the crosstalk from pixel section 100R can be decreased.

For example, in assuming that a thickness of semiconductor substrate 1 is 5 μm, photodiode 11 of pixel section 100B having blue color filter 17 is formed to a depth of about 2 μm from the back surface of semiconductor substrate 1, photodiode 11 of pixel section 100G having green color filter 18 is formed to a depth of about 3.8 μm from the back surface of semiconductor substrate 1, and photodiode 11 of pixel section 100R having red color filter 19 is formed to a depth of about 4.7 μm from the back surface of semiconductor substrate 1. In configuring as above, the transmitted light with the transmitting wavelength of 450 nm for pixel section 100B having blue color filter 17 and the transmitted light with the transmitting wavelength of 550 nm for pixel section 100G having green color filter 18 are mostly photoelectrically converted at their corresponding photodiodes 11. Accordingly, sensitivity in pixel sections 100B and 100G is not lowered. On the other hand, since part of the transmitted light with the transmitting wavelength of 650 nm for pixel section 100R having red color filter 19 that is not photoelectrically converted by photodiode 11 vanishes by respective high concentration p-type layers 21 to 23, the crosstalk from pixel section 100R is significantly decreased. Specifically, the crosstalk is halved compared to the conventional technique, and a value of a ratio of an output value of pixel section 100R with respect to an output value of pixel section 100G having green color filter 18 that is adjacent to pixel section 100R having red color filter 19 is about 1%.

Hereinafter, a summary of a method of manufacturing the solid-state imaging device of the present exemplary embodiment will be described.

Photodiodes (photoelectric conversion sections) 11 of the n-type are formed by selectively performing an ion implantation with implantation energy of 200 keV to 2000 keV and an n-type impurity concentration of phosphorus, arsenic or the like at $1 \times 10^{14}/cm^3$ to $1 \times 10^{17}/cm^3$.

Isolation sections 13 are selectively formed by a publicly-known STI (Shallow Trench Isolation) structure or LOCOS (Local Oxidation of Silicon) structure.

Isolating diffusion layers 10 of the p-type are formed by selectively performing an ion implantation with implantation energy of 100 keV to 3000 keV and a p-type impurity concentration of boron or the like at $1 \times 10^{15}/cm^3$ to $1 \times 10^{18}/cm^3$.

First high concentration p-type layer 20 is formed by performing an ion implantation with implantation energy of 1 keV to 100 keV and a p-type impurity concentration at $1 \times 10^{17}/cm^3$ to $1 \times 10^{20}/cm^3$. Accordingly, by making the impurity concentration of first high concentration p-type layer 20 as high concentration, a lifetime of generated charges becomes short, and the generated charges caused by defects are prevented from flowing into photodiodes 11.

Second high concentration p-type layer 21 is formed by selectively performing an ion implantation with implantation energy of 1 keV to 1500 keV and a p-type impurity concentration at $1 \times 10^{17}/cm^3$ to $1 \times 10^{20}/cm^3$ to pixel section 100B. Third high concentration p-type layer 22 is formed by selectively performing an ion implantation with implantation energy of 1 keV to 800 keV and a p-type impurity concentration at $1 \times 10^{17}/cm^3$ to $1 \times 10^{20}/cm^3$ to pixel section 100G. Fourth high concentration p-type layer 23 is formed by selectively performing an ion implantation with implantation energy of 1 keV to 100 keV and a p-type impurity concentration at $1 \times 10^{17}/cm^3$ to $1 \times 10^{20}/cm^3$ to pixel section 100R.

Note that, parts of photodiodes 11 in pixel sections 100B, 100G and 100R, that is, a center portion of each of pixel sections 100B, 100G and 100R that is in the vicinity of the substrate surface are formed at similar depths via corresponding high concentration p-type layers 21 to 23. As mentioned above, the stored charges are transferred to a floating diffusion portion from a shallow portion in this photodiode 11.

Further, similar to first high concentration p-type layer 20, the lifetime of the generated charges is shortened by making the impurity concentration of each of high concentration p-type layers 21 to 23 high, and each of high concentration p-type layers 21 to 23 can prevent the generated charges due to the defects to flow to each photodiode 11.

As described above, according to the present exemplary embodiment, the crosstalk from pixel section 100R due to the oblique incident light with the long wavelength can be decreased while maintaining the sensitivity of respective pixel sections 100B, 100G and 100R.

Note that, the region in the n-type impurity region configuring photodiode (photoelectric conversion section) 11 with the maximum width in the direction parallel to the substrate surface is a region surrounded by p-type isolating diffusion layers 10, and is an n-type impurity high concentration region that is positioned closest to the charge detection surface of semiconductor substrate 1. Due to being the n-type high concentration region, an influence of thermal diffusion of the p-type impurities in p-type isolating diffusion layers 10 can be reduced, thus the width of the region of photodiode 11 becomes maximum.

(First Modification of Exemplary Embodiment)

Hereinafter, a first modification of the exemplary embodiment will be described with reference to FIG. 2.

Figure 2:
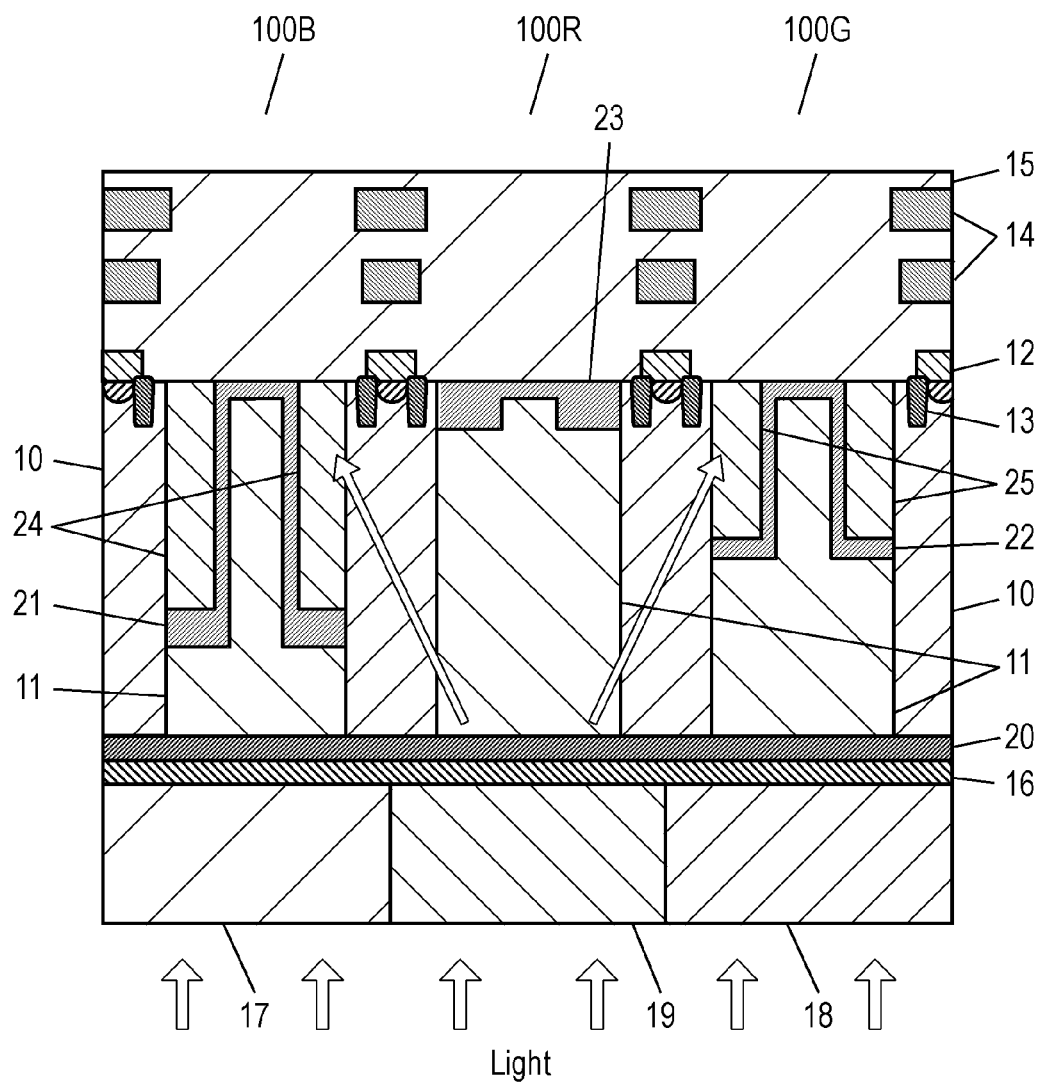
FIG. 2 is a schematic partial cross sectional view showing pixel sections in a solid-state imaging device of a first modification of an exemplary embodiment of the present invention.

FIG. 2 is a cross sectional configuration of pixel sections 100B, 100G and 100R in a solid-state imaging device of the first modification, and three pixel sections are shown herein. Note that, as for FIG. 2, a description of constituent components identical to the constituent components shown in FIG. 1 will be omitted by giving identical reference signs.

As shown in FIG. 2, first overflow drain layer 24 of n-type is formed inside second high concentration p-type diffusion layer 21 in pixel section 100B having blue color filter 17. Similar to this, second overflow drain layer 25 of n-type is formed inside third high concentration p-type diffusion layer 22 in pixel section 100G having green color filter 18. In configuring as above, unlike the exemplary embodiment, the second high concentration p-type layer 21 and third high concentration p-type layer 22 no longer need to be formed as regions whose p-type impurity concentration is high. In addition, even in such configuration, in pixel sections 100B and 100G adjacent to pixel section 100R having red color filter 19, since the charges generated by the oblique incident light from pixel section 100R can be prevented from flowing into photodiodes 11, it becomes possible to decrease the crosstalk.

Note that, a ground (GND) voltage or a power source voltage to be applied to output circuit 12 is applied to each of overflow drain layers 24 and 25, and thereby the photoelectrically converted charges are moved to an applied voltage side.

A manufacturing method that realizes this first modification is substantially similar to that of the above described exemplary embodiment.

As a difference from the exemplary embodiment, p-type impurity concentration in second high concentration p-type layer 21 and third high concentration p-type layer 22 is made to be $1 \times 10^{15}/cm^3$ to $1 \times 10^{18}/cm^3$, and in this case also, a leakage of a pn junction with photodiode 11 can be suppressed to one tenth or less compared to a structure of the exemplary embodiment.

Further, first overflow drain layer 24 formed in pixel section 100B having blue color filter 17 is formed by selectively performing an ion implantation with implantation energy of 10 keV to 1500 keV and n-type impurity concentration at $1 \times 10^{15}/cm^3$ to $1 \times 10^{18}/cm^3$.

Second overflow drain layer 25 formed in pixel section 100G having green color filter 18 is formed by selectively performing an ion implantation with implantation energy of 10 keV to 800 keV and n-type impurity concentration at $1 \times 10^{15}/cm^3$ to $1 \times 10^{18}/cm^3$.

Due to this, it becomes possible to suppress noise to one tenth or less while maintaining the crosstalk property and sensitivity property similar to the exemplary embodiment.

(Second Modification of Exemplary Embodiment)

Hereinafter, a second modification of the exemplary embodiment will be described with reference to FIG. 3.

Figure 3:
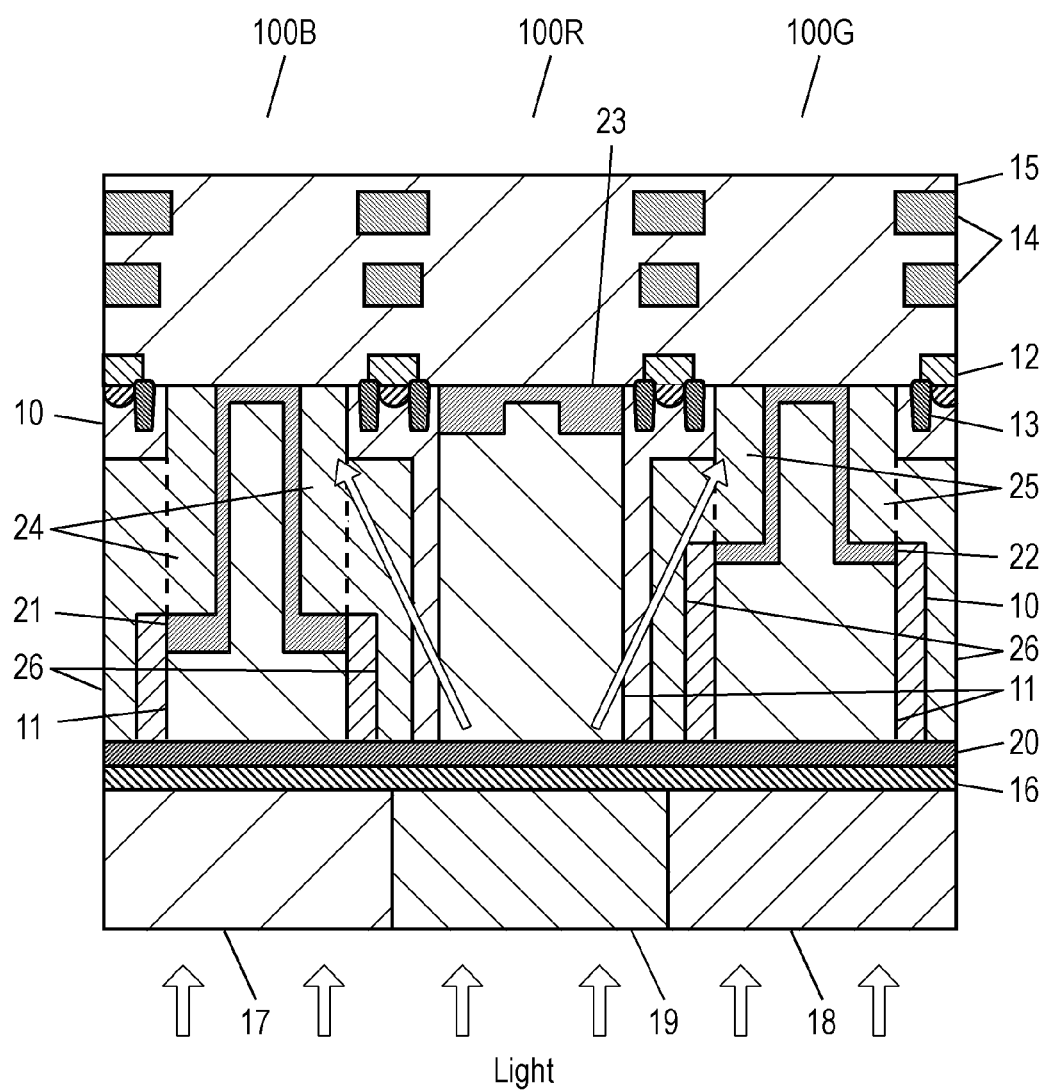
FIG. 3 is a schematic partial cross sectional view showing pixel sections in a solid-state imaging device of a second modification of the exemplary embodiment of the present invention.

FIG. 3 is a cross sectional configuration of pixel sections 100B, 100G and 100R in a solid-state imaging device of the second modification, and three pixel sections are shown herein. Note that, as for FIG. 3, a description of constituent components identical to the constituent components shown in FIG. 1 and FIG. 2 will be omitted by giving identical reference signs.

As a difference from the first modification, as shown in FIG. 3, third overflow drain layers 26 of n-type are formed inside respective isolating diffusion layers 10 of p-type in pixel section 100B having blue color filter 17 and pixel section 100G having green color filter 18. Here, each of third overflow drain layers 26 is electrically connected to each of first overflow drain layer 24 and second overflow drain layer 25.

Due to this configuration, even if an angle of oblique incident light having long wavelength reaching the deep portion on the substrate surface side of semiconductor substrate 1 becomes large, the charges generated by the oblique incident light in pixel section 100R can be prevented from flowing into photodiodes 11 in pixel sections 100B and 100G that are adjacent to pixel section 100R having red color filter 19; thus, it becomes possible to decrease the crosstalk from pixel section 100R.

The crosstalk is decreased compared to the conventional technique, and for example, a value of a ratio of an output value of pixel section 100R with respect to an output value of pixel section 100G having green color filter 18 that is adjacent to pixel section 100R having red color filter 19 is about 0.5%.

Note that, a ground (GND) voltage or a power source voltage to be applied to output circuit 12 is applied to each of overflow drain layers 24 to 26, and thereby the photoelectrically converted charges are moved to an applied voltage side.

A manufacturing method that realizes this second modification is substantially similar to that of the above described first modification.

As a difference from the first modification, third overflow drain layers 26 formed in pixel section 100B having blue color filter 17 and pixel section 100G having green color filter 18 are formed by selectively performing an ion implantation with implantation energy of 200 keV to 2000 keV and n-type impurity concentration at $1 \times 10^{15}/cm^3$ to $1 \times 10^{18}/cm^3$ on p-type isolating diffusion layers 10.

Due to this, third overflow drain layers 26 are formed so as to electrically connect with first overflow drain layer 24 of pixel section 100B having blue color filter 17 and second overflow drain layer 25 of pixel section 100G having green color filter 18 respectively, and are formed inside p-type isolating diffusion layers 10 so as to surround photodiodes 11 of respective pixel sections 100B and 100G.

As described above, according to the second modification, even if an angle of oblique incident light with a long wavelength incident on pixel section 100R having red color filter 19 becomes large, the crosstalk caused by pixel section 100R can be decreased. Further, since concentrating light by forming lenses above respective color filters 17 to 19 becomes no longer necessary, it becomes possible to suppress the crosstalk to be 1% or less. That is, even if light is made incident on p-type isolating diffusion layers 10 without being concentrated, since the photoelectrically converted charges move from respective overflow drain layers 24 to 26 to the GND or the power source voltage, they do not flow into respective photodiodes 11.

Due to this, in the solid-state imaging device of the second modification, since a lens forming step becomes unnecessary, a TAT (Turn Around Time) in the manufacturing process can be shortened and a manufacturing cost can be reduced.

(Third Modification of Exemplary Embodiment)

Hereafter, a third modification of the exemplary embodiment will be described with reference to FIG. 4 and FIG. 5.

Figure 4:
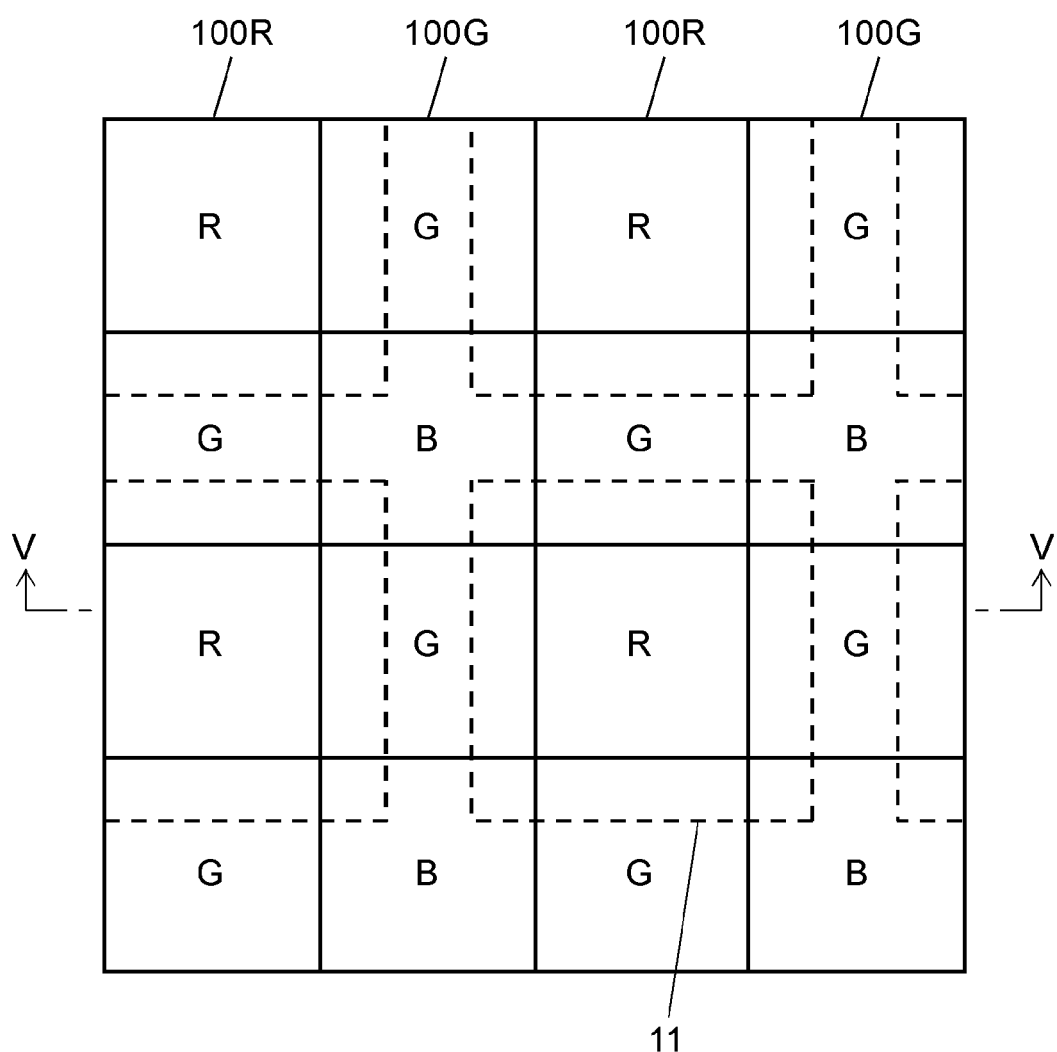
FIG. 4 is a schematic plan view showing an imaging region in a solid-state imaging device of a third modification of the exemplary embodiment of the present invention.
Figure 5:
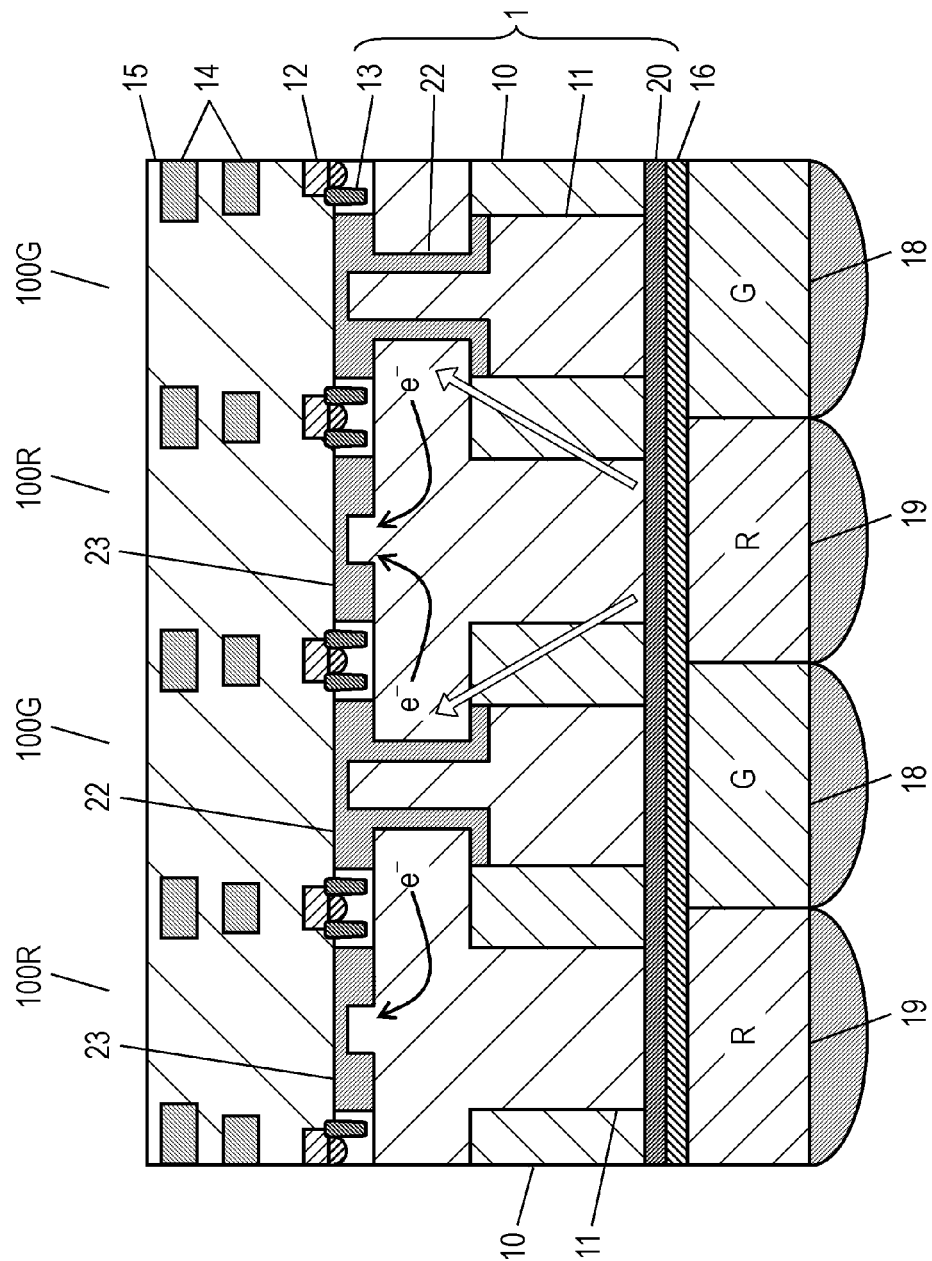
FIG. 5 is a schematic partial cross sectional view along line V-V in FIG. 4.

FIG. 4 shows a plan view of an imaging region including pixel sections 100B, 100G and 100R that are arranged in a Beyer arrangement in a solid-state imaging device of the second modification, and FIG. 5 shows a cross sectional configuration along line V-V in FIG. 4. Note that, as for FIG. 4 and FIG. 5, a description of constituent components identical to the constituent components shown in FIG. 1 will be omitted by giving identical reference signs.

As a difference from the exemplary embodiment, as shown in FIG. 5, in pixel section 100R having red color filter 19, a lower side portion of fourth high concentration p-type layer 23 in photodiode (photoelectric conversion section) 11 is formed to extend into isolating diffusion layers 10 and third high concentration p-type layers 22 adjacent to the photodiode 11. That is, photodiode 11 in pixel section 100R is formed to have a maximum cross sectional area in the direction parallel to the light incident surface inside the semiconductor substrate 1, compared to an opening area at the light incident surface and an opening area at the charge detection surface. Further, in other words, a region with a maximum width in the direction parallel to the light incident surface in photodiode 11 of pixel section 100R is formed to extend under photodiode 11 of pixel section 100G having green color filter 18 that is adjacent to photodiode 11 (under the charge detection surface).

According to the third modification, of the incident light with long wavelength incident on pixel section 100R having red color filter 19, the charges photoelectrically converted by the oblique incident light can be prevented from flowing into photodiode 11 of adjacent pixel section 100G. In addition, the sensitivity of pixel section 100R itself also improves. The crosstalk is halved compared to the conventional technique, and a value of a ratio of an output value of pixel section 100R with respect to an output value of pixel section 100G having green color filter 18 that is adjacent to pixel section 100R having red color filter 19 is about 0.3%. That is, the leakage of the charges generated in the deep portion of semiconductor substrate 1 on the charge detection surface side into photodiode 11 of pixel section 100G adjacent to pixel section 100R is prevented, and it becomes possible to capture them in photodiode 11 of pixel section 100R.

In the third modification, in extending photodiode 11 of pixel section 100R to underneath photodiode 11 of pixel section 100G having green color filter 18 and adjacent to pixel section 100R having red color filter 19, the sensitivity of pixel section 100R is increased by 1.3 times compared to the configuration of the exemplary embodiment.

Note that, in stopping photodiode 11 of pixel section 100R at isolating diffusion layers 10, the sensitivity of pixel section 100R is increased by 1.1 times compared to the configuration of the exemplary embodiment. Further, the crosstalk in this case is about 0.6%.

A manufacturing method that realizes this third modification is substantially similar to that of the above described exemplary embodiment.

As a difference from the exemplary embodiment, in a case of forming photodiode 11 of pixel section 100R having red color filter 19 under respective photodiodes 11 of pixel section 100B having blue color filter 17 and pixel section 100G having green color filter 18, implantation energy is of 200 keV to 800 keV and n-type impurity concentration is at $1 \times 10^{14}/cm^3$ to $1 \times 10^{17}/cm^3$.

Note that, in photodiode 11 of pixel section 100B having the blue color filter 17, an area occupied by second high concentration p-type layer 21 is large. Accordingly, photodiode 11 of pixel section 100R having red color filter 19 may be formed inside second high concentration p-type layer 21 with larger size than in forming the same inside third high concentration p-type layer 22. Accordingly, by adjusting the implantation energy and injection concentration of the n-type impurities with respect to second high concentration p-type layer 21 and third high concentration p-type layer 22, the sensitivity of pixel section 100R having red color filter 19 can be improved, and the crosstalk thereof can be decreased.

Note that, the opening areas of photodiodes (photoelectric conversion sections) 11 of respective pixel sections 100B, 100G and 100R mean areas of regions near the light incident surface of semiconductor substrate 1 in photodiodes 11 and surrounded by isolating diffusion layers 10 of the p-type, or regions near the charge detection surface and surrounded by respective high concentration p-type layers 21, 22 and 23.

Respective photodiodes 22 have a structure having a polygonal cross sectional shape in the direction parallel to the light incident surface, and in which their peripheries are surrounded by isolating diffusion layers 10 of the p-type or respective high concentration p-type layers 21, 22 and 23.

Further, as shown in FIG. 5, in the third modification, in pixel section 100R having the red filter the opening area near the charge detection surface side in photodiode 11 is larger than the opening area near the light incident surface side.

As described above, according to the third modification, since the oblique incident light reaching the deep portion near the charge detection surface side of semiconductor substrate 1 can be gathered in photodiode 11 effectively in pixel section 100R having the red filter 19, the crosstalk can be decreased while maintaining the high sensitivity. Further, even if the size of respective pixel sections is reduced and thereby formed narrow similar to respective isolating diffusion layers 10, electrical separation with other photodiodes 11 adjacent to pixel section 100R is possible without forming the impurity injection to the p-type impurity injection regions at deep positions; thus, the crosstalk decreases.

Since the depth of the photoelectric conversion sections from a substrate surface can be adjusted according to the light wavelength, the solid-state imaging device of the present invention can realize high sensitivity and low crosstalk while maintaining the charge reading at low voltage. It is useful in solid-state imaging devices in which pixel sections including photoelectric conversion sections are arranged in a matrix.

What is claimed is:
1. A solid-state imaging device comprising:
a semiconductor substrate;
a plurality of first impurity regions of a first conductivity type that are formed in the semiconductor substrate and arranged in a matrix;
a detection circuit section that is formed on a first surface of the semiconductor substrate;
a plurality of isolating diffusion layers of a second conductivity type that are formed in the semiconductor substrate between the first impurity regions disposed adjacent to each other;
a plurality of second impurity regions of the second conductivity type making contact with the first impurity regions respectively; and
a plurality of color filters that are formed on a second surface opposing the first surface of the semiconductor substrate and transmit light with different wavelengths, wherein
each of the second impurity regions has an indentation extending along a direction from the second surface toward the first surface of the semiconductor substrate.
2. The solid-state imaging device according to claim 1, wherein
the second impurity regions include a first region corresponding to a first color filter that has a maximum transparency in a first wavelength region and a second region corresponding to a second color filter that has the maximum transparency in a second wavelength region having longer wavelength than the first wavelength region, and
a depth of the indentation of the first region of the second impurity regions is deeper than that of the second region of the second impurity regions.
3. The solid-state imaging device according to claim 1, wherein
each of the first impurity regions has a projecting portion which is disposed inside the indentations respectively.
4. The solid-state imaging device according to claim 1, further comprising:
a plurality of overflow drain layers of the first conductivity type, each of the overflow drain layers is disposed between one of the second impurity regions and one of the isolation diffusion layers.
5. The solid-state imaging device according to claim 2, further comprising:
a plurality of overflow drain layers of the first conductivity type, each of the overflow drain layers is disposed between one of the second impurity regions and one of the isolation diffusion layers.
6. The solid-state imaging device according to claim 1, wherein
the first impurity regions include a first region corresponding to a first color filter that has a maximum transparency in a first wavelength region and a second region corresponding to a second color filter that has the maximum transparency in a second wavelength region having longer wavelength than the first wavelength region, and
the second region of the first impurity regions extends along the first surface of the semiconductor substrate to be in contact with one of the second impurity regions making contact with the first region of the first impurity regions.
7. The solid-state imaging device according to claim 2, wherein
the first impurity regions include a first region corresponding to a first color filter that has a maximum transparency in a first wavelength region and a second region corresponding to a second color filter that has the maximum transparency in a second wavelength region having longer wavelength than the first wavelength region, and
the second region of the first impurity regions extends along the first surface of the semiconductor substrate to be in contact with one of the second impurity regions making contact with the first region of the first impurity regions.
8. The solid-state imaging device according to claim 1, wherein
the second impurity regions have a higher impurity concentration than the isolating diffusion layers.
9. A solid-state imaging device comprising:
a semiconductor substrate;
a plurality of first impurity regions of a first conductivity type that are formed in the semiconductor substrate and arranged in a matrix;
a detection circuit section that is formed on a first surface of the semiconductor substrate;
a plurality of isolating diffusion layers of a second conductivity type that are formed in the semiconductor substrate between the first impurity regions disposed adjacent to each other;

a plurality of second impurity regions of the second conductivity type making contact with the first impurity regions respectively; and a plurality of color filters that are formed on a second surface opposing the first surface of the semiconductor substrate and transmit light with different wavelengths, wherein each of the first impurity regions has a projecting portion extending along a direction from the second surface toward the first surface of the semiconductor substrate, and at least a part of each of the second impurity regions is disposed between the projecting portion and one of the isolation diffusion layers at both sides of the projecting portion.

10. The solid-state imaging device according to claim 9, wherein the first impurity regions include a first region corresponding to a first color filter that has a maximum transparency in a first wavelength region and a second region corresponding to a second color filter that has the maximum transparency in a second wavelength region having longer wavelength than the first wavelength region, and a length of the projecting portion of the first region of the first impurity regions is longer than that of the second region of the first impurity regions.

11. The solid-state imaging device according to claim 9, further comprising:

a plurality of overflow drain layers of the first conductivity type, each of the overflow drain layers is disposed between one of the second impurity regions and one of the isolation diffusion layers.

12. The solid-state imaging device according to claim 10, further comprising:

a plurality of overflow drain layers of the first conductivity type, each of the overflow drain layers is disposed between one of the second impurity regions and one of the isolation diffusion layers.

13. The solid-state imaging device according to claim 9, wherein the first impurity regions include a first region corresponding to a first color filter that has a maximum transparency in a first wavelength region and a second region corresponding to a second color filter that has the maximum transparency in a second wavelength region having longer wavelength than the first wavelength region, and the second region of the first impurity regions extends along the first surface of the semiconductor substrate to be in contact with one of the second impurity regions making contact with the first region of the first impurity regions.

14. The solid-state imaging device according to claim 10, wherein the first impurity regions include a first region corresponding to a first color filter that has a maximum transparency in a first wavelength region and a second region corresponding to a second color filter that has the maximum transparency in a second wavelength region having longer wavelength than the first wavelength region, and the second region of the first impurity regions extends along the first surface of the semiconductor substrate to be in contact with one of the second impurity regions making contact with the first region of the first impurity regions.

15. The solid-state imaging device according to claim 9, wherein the second impurity regions have a higher impurity concentration than the isolating diffusion layers.

* * * * *